(12) United States Patent
Park et al.

(10) Patent No.: US 9,524,828 B2
(45) Date of Patent: *Dec. 20, 2016

(54) MULTILAYERED CERAMIC CAPACITOR AND MOUNTING THE SAME

(71) Applicant: SAMSUNG ELECTRO-MECHANICS CO., LTD., Suwon, Gyunggi-do (KR)

(72) Inventors: Min Cheol Park, Gyunggi-do (KR); Heung Kil Park, Gyunggi-do (KR)

(73) Assignee: Samsung Electro-Mechanics, Co., Ltd., Suwon-si, Gyeonggi-do (KR)

( * ) Notice: Subject to any disclaimer, the term of this patent is extended or adjusted under 35 U.S.C. 154(b) by 595 days.

This patent is subject to a terminal disclaimer.

(21) Appl. No.: 13/949,838

(22) Filed: Jul. 24, 2013

(65) Prior Publication Data

US 2014/0311785 A1    Oct. 23, 2014

(30) Foreign Application Priority Data

Apr. 22, 2013    (KR) .................. 10-2013-0044157

(51) Int. Cl.
*H05K 1/16* (2006.01)
*H01G 4/38* (2006.01)
(Continued)

(52) U.S. Cl.
CPC ............. *H01G 4/385* (2013.01); *H01G 4/232* (2013.01); *H01G 4/30* (2013.01); *H05K 1/181* (2013.01)

(58) Field of Classification Search
CPC .......... H01G 4/30; H01G 4/232; H01G 4/012; H01G 4/005; H01G 2/14; H01G 4/228; H01G 4/2325
(Continued)

(56) References Cited

U.S. PATENT DOCUMENTS 7,388,738 B1    6/2008 Togashi et al.
2003/0011963 A1    1/2003 Ahiko et al.
(Continued)

FOREIGN PATENT DOCUMENTS

CN    1397965 A    2/2003
JO    2009-060114 A    3/2009
(Continued)

OTHER PUBLICATIONS

Office Action issued on Jun. 3, 2014 in the corresponding Japanese Patent Application No. 2013-150227.
(Continued)

*Primary Examiner* — Tremesha S Willis
(74) *Attorney, Agent, or Firm* — McDermott Will & Emery LLP

(57) ABSTRACT

A multilayer ceramic capacitor includes a ceramic body including dielectric layers and having first and second side surfaces opposing each other; a first capacitor part including a first internal electrode exposed to the first side surface and a second internal electrode exposed to the second side surface and a second capacitor part including a third internal electrode exposed to the first side surface and a fourth internal electrode exposed to the second side surface; first and second internal connection conductors exposed to the first and second side surfaces; and first to fourth external electrodes formed on the first and second side surfaces and electrically connected to the first to fourth internal electrodes and the first and second internal connection conductors, the first and second capacitor parts being connected in series with the first and second internal connection conductors, respectively.

28 Claims, 10 Drawing Sheets

(51) Int. Cl.
*H05K 1/18* (2006.01)
*H01G 4/30* (2006.01)
*H01G 4/232* (2006.01)

(58) Field of Classification Search
USPC .......... 174/260; 361/301.2, 301.4, 303–305, 361/306.1, 306.3, 321.1, 321.2
See application file for complete search history.

(56) References Cited

U.S. PATENT DOCUMENTS

| | | |
|---|---|---|
| 2008/0013250 A1 | 1/2008 | Aoki |
| 2008/0158773 A1 | 7/2008 | Lee et al. |
| 2008/0291600 A1 | 11/2008 | Takashima et al. |
| 2009/0059469 A1 | 3/2009 | Lee et al. |
| 2009/0086403 A1 | 4/2009 | Lee et al. |
| 2009/0139757 A1 | 6/2009 | Lee et al. |
| 2009/0323253 A1 | 12/2009 | Kobayashi et al. |
| 2010/0109804 A1 | 5/2010 | Feichtinger |
| 2010/0321860 A1 | 12/2010 | Osawa |
| 2012/0162853 A1 | 6/2012 | Togashi |

FOREIGN PATENT DOCUMENTS

| | | |
|---|---|---|
| JP | 2004-273701 A | 9/2004 |
| JP | 2008-021797 A | 1/2008 |
| JP | 2008-244484 A | 10/2008 |
| JP | 2009004734 A | 1/2009 |
| JP | 2010-034503 A | 2/2010 |
| JP | 2010-526429 A | 7/2010 |
| JP | 2011-216898 A | 10/2011 |
| JP | 2012-138415 A | 7/2012 |
| JP | 2012-156191 A | 8/2012 |
| JP | 5118237 B2 | 1/2013 |
| JP | 5152278 B2 | 2/2013 |
| KR | 10-0809239 B1 | 3/2008 |
| WO | WO-2008/050657 A1 | 5/2008 |

OTHER PUBLICATIONS

Korean Office Action issued in Korean Application No. 10-2013-0044156 dated Jul. 24, 2014, w/English translation.
Chinese Office Action issued in Chinese Application No. 201310342102.7 dated Jun. 3, 2016, with English Translation.

MULTILAYERED CERAMIC CAPACITOR AND MOUNTING THE SAME

CROSS-REFERENCE TO RELATED APPLICATIONS

This application claims the priority of Korean Patent Application No. 10-2013-0044156 filed on Apr. 22, 2013, in the Korean Intellectual Property Office, the disclosure of which is incorporated herein by reference.

BACKGROUND OF THE INVENTION

Field of the Invention

The present invention relates to a multilayer ceramic capacitor and a board for mounting the same.

Description of the Related Art

A multilayer ceramic capacitor, a multilayer chip electronic component, is a chip-shaped condenser mounted on a printed circuit board of various electronic products such as display devices, for example, liquid crystal displays (LCDs), plasma display panels (PDPs) and the like, computers, smartphones, mobile phones, and the like, to serve to charge and discharge electricity.

Since such a multilayer ceramic capacitor (MLCC) has advantages such as a small size, high capacitance, ease of mounting, or the like, it may be used as a component in various electronic devices.

The multilayer ceramic capacitor may have a structure in which a plurality of dielectric layers and internal electrodes having different polarities are alternately stacked while having the dielectric layer interposed therebetween.

Particularly, in a power supply device for the central processing unit (CPU) of a computer, or the like, voltage noise may be generated during a process of supplying a low amount of voltage, due to rapid changes in load current.

Therefore, such a multilayer ceramic capacitor has been widely used in power supply devices as a decoupling capacitor for suppressing such voltage noise.

The multilayer ceramic capacitor for decoupling should have low equivalent series inductance (ESL) as an operational frequency thereof is increased. Research has been undertaken in order to decrease such ESL.

Further, in order to more stably supply power, the multilayer ceramic capacitor for decoupling should have controllable equivalent series resistance (ESR) characteristics.

In the case in which an ESR value of the multilayer ceramic capacitor is lower than a required level, an impedance peak at a parallel resonance frequency, generated due to the ESL of the capacitor and a plane capacitance of a micro processor package, may increase, and impedance at a series resonance frequency of the capacitor may excessively decrease.

Therefore, in order to allow a user to implement flat impedance characteristics in a power distribution network, the ESR characteristics of the multilayer ceramic capacitor for decoupling should be easily controllable.

With regard to control of the ESR characteristics, the use of a material having a high degree of electrical resistance in external and internal electrodes may be considered. The measure of changing the material as described above may provide high ESR characteristics while maintaining a low ESL structure according to the related art.

However, in the case of using such a material having a high degree of resistance in the external electrodes, a localized heat spot causing a current crowding effect may be generated due to pin holes. Further, in the case of using such a material having a high degree of resistance in the internal electrodes, in order to match the material with a ceramic material in order to implement a high degree of capacitance, the material used for formation of the internal electrodes should also be continuously changed.

Therefore, since the existing measure for controlling ESR has the above-described disadvantages, research into a multilayer ceramic capacitor in which ESR is able to be controlled is still required.

In addition, in accordance with the recent trend for the rapid development of mobile terminals such as tablet personal computers (PCs), ultrabooks, and the like, a micro processor has been converted into a miniaturized and highly integrated product.

Therefore, an area of the printed circuit board has decreased, and a mounting space of the decoupling capacitor has also been limited, and accordingly, a multilayer ceramic capacitor able to be mounted, when limited mounting space is available, is still required.

RELATED ART DOCUMENT (Patent Document 1) Japanese Patent Laid-open Publication No. 2012-138415

SUMMARY OF THE INVENTION

An aspect of the present invention provides a multilayer ceramic capacitor and a board for mounting the same.

According to an aspect of the present invention, there is provided a multilayer ceramic capacitor including: a ceramic body including a plurality of dielectric layers and having first and second main surfaces opposing each other, first and second side surfaces opposing each other, and first and second end surfaces opposing each other; a first capacitor part formed in the ceramic body and including a first internal electrode having a lead exposed to the first side surface and a second internal electrode having a lead exposed to the second side surface and a second capacitor part formed in the ceramic body and including a third internal electrode having a lead exposed to the first side surface and spaced apart from the lead of the first internal electrode and a fourth internal electrode having a lead exposed to the second side surface and spaced apart from the lead of the second internal electrode; first and second internal connection conductors formed in the ceramic body and exposed to the first and second side surfaces; and first to fourth external electrodes formed on the first and second side surfaces of the ceramic body and electrically connected to the first to fourth internal electrodes and the first and second internal connection conductors, wherein the first and second capacitor parts are connected in series with the first and second internal connection conductors, respectively.

The first and second external electrodes may be disposed to be spaced apart from each other on the first side surface of the ceramic body, and the third and fourth external electrodes may be disposed to be spaced apart from each other on the second side surface of the ceramic body.

A mounting surface of the multilayer ceramic capacitor may be the first or second side surface of the ceramic body.

The lead of the first internal electrode may be connected to the first external electrode, the lead of the second internal electrode may be connected to the fourth external electrode, the lead of the third internal electrode may be connected to the second external electrode, and the lead of the fourth internal electrode may be connected to the third external electrode.

The first internal connection conductor may be connected to the first internal electrode via the first external electrode and connected to the fourth internal electrode via the third external electrode.

The second internal connection conductor may be connected to the second internal electrode via the fourth external electrode and connected to the third internal electrode via the second external electrode.

The first and third internal electrodes may be formed to be spaced apart from each other on a single layer in a cross-section of the ceramic body in a length-width direction, and the second and fourth internal electrodes may be formed to be spaced apart from each other on another single layer in the cross-section of the ceramic body in the length-width direction.

The lead of the first internal electrode may be connected to the first external electrode, the lead of the second internal electrode may be connected to the third external electrode, the lead of the third internal electrode may be connected to the second external electrode, and the lead of the fourth internal electrode may be connected to the fourth external electrode.

The first internal connection conductor may be connected to the first internal electrode via the first external electrode and connected to the fourth internal electrode via the fourth external electrode.

The second internal connection conductor may be connected to the second internal electrode via the third external electrode and connected to the third internal electrode via the second external electrode.

The multilayer ceramic capacitor may further include: a third capacitor part formed in the ceramic body and including a fifth internal electrode exposed to the first side surface and a sixth internal electrode exposed to the second side surface and a fourth capacitor part formed in the ceramic body and including seventh and eighth internal electrodes, wherein the fifth and seventh internal electrodes are formed to be spaced apart from each other on a single layer in the cross-section of the ceramic body in the length-width direction, and the sixth and eighth internal electrodes are formed to be spaced apart from each other on another single layer in the cross-section of the ceramic body in the length-width direction.

The fifth internal electrode may be connected to the first external electrode, the sixth internal electrode may be connected to the third external electrode, the seventh internal electrode may be connected to the second external electrode, and the eighth internal electrode may be connected to the fourth external electrode.

According to another aspect of the present invention, there is provided a multilayer ceramic capacitor including: a ceramic body including a plurality of dielectric layers and having first and second main surfaces opposing each other, first and second side surfaces opposing each other, and first and second end surfaces opposing each other; first, third, fifth, and seventh internal electrodes exposed to the first side surface and formed to be spaced apart from each other on a single layer in a cross section of the ceramic body in a length-width direction and second, fourth, sixth, and eighth internal electrodes exposed to second side surface and formed to be spaced apart from each other on another single layer in the cross section of the ceramic body in the length-width direction; first to fourth internal connection conductors formed in the ceramic body and exposed to the first and second side surfaces; and first to eighth external electrodes formed on the first and second side surfaces and electrically connected to the first to eighth internal electrodes and the first to fourth internal connection conductors, wherein the first and second internal electrodes, the third and fourth internal electrodes, the fifth and sixth internal electrodes, and the seventh and eighth internal electrodes form first, second, third, and fourth capacitor parts, respectively, the first and second capacitor parts being connected in series with the first and second internal connection conductors, respectively, and the third and fourth capacitor parts being connected in series with the third and fourth internal connection conductors, respectively.

The first to fourth external electrodes may be disposed to be spaced apart from each other on the first side surface of the ceramic body, and the fifth to eighth external electrodes may be disposed to be spaced apart from each other on the second side surface of the ceramic body.

A mounting surface of the multilayer ceramic capacitor may be the first or second side surface of the ceramic body.

The first, third, fifth, seventh, second, fourth, sixth, and eighth internal electrodes may be connected to the first to eighth external electrodes, respectively.

The first internal connection conductor may be connected to the first internal electrode via the first external electrode and connected to the fourth internal electrode via the sixth external electrode.

The second internal connection conductor may be connected to the second internal electrode via the fifth external electrode and connected to the third internal electrode via the second external electrode.

The third internal connection conductor may be connected to the fifth internal electrode via the third external electrode and connected to the eighth internal electrode via the eighth external electrode.

The fourth internal connection conductor may be connected to the sixth internal electrode via the seventh external electrode and connected to the seventh internal electrode via the fourth external electrode.

According to another aspect of the present invention, there is provided a multilayer ceramic capacitor including: a ceramic body including a plurality of dielectric layers and having first and second main surfaces opposing each other, first and second side surfaces opposing each other, and first and second end surfaces opposing each other; a first capacitor part formed in the ceramic body and including a first internal electrode having a lead exposed to the second side surface and a second internal electrode having a lead exposed to the first side surface and a second capacitor part formed in the ceramic body and including a third internal electrode having a lead exposed to the second side surface and spaced apart from the lead of the first internal electrode and a fourth internal electrode having a lead exposed to the first side surface and spaced apart from the lead of the second internal electrode; first to third internal connection conductors formed in the ceramic body and exposed to the first and second side surfaces; and first to sixth external electrodes formed on the first and second side surfaces of the ceramic body and electrically connected to the first to fourth internal electrodes and the first to third internal connection conductors, wherein the first capacitor part is connected in series with the first and second internal connection conductors, and the second capacitor part is connected in series with the second and third internal connection conductors.

The first to third external electrodes may be disposed to be spaced apart from each other on the first side surface of the ceramic body, and the fourth to sixth external electrodes may be disposed to be spaced apart from each other on the second side surface of the ceramic body.

Amounting surface of the multilayer ceramic capacitor may be the first or second side surface of the ceramic body.

The lead of the first internal electrode may be connected to the fourth external electrode, the lead of the second internal electrode may be connected to the second external electrode, the lead of the third internal electrode may be connected to the fifth external electrode, and the lead of the fourth internal electrode may be connected to the third external electrode.

The first internal connection conductor may be connected to the first external electrode, and be connected to the first internal electrode via the fourth external electrode.

The second internal connection conductor may be connected to the second internal electrode via the second external electrode and connected to the third internal electrode via the fifth external electrode.

The third internal connection conductor may be connected to the sixth external electrode, and be connected to the fourth internal electrode via the third external electrode.

According to another aspect of the present invention, there is provided a board for mounting a multilayer ceramic capacitor, the board including: a printed circuit board having first and second electrode pads thereon; and the multilayer ceramic capacitor as described above mounted on the printed circuit board.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
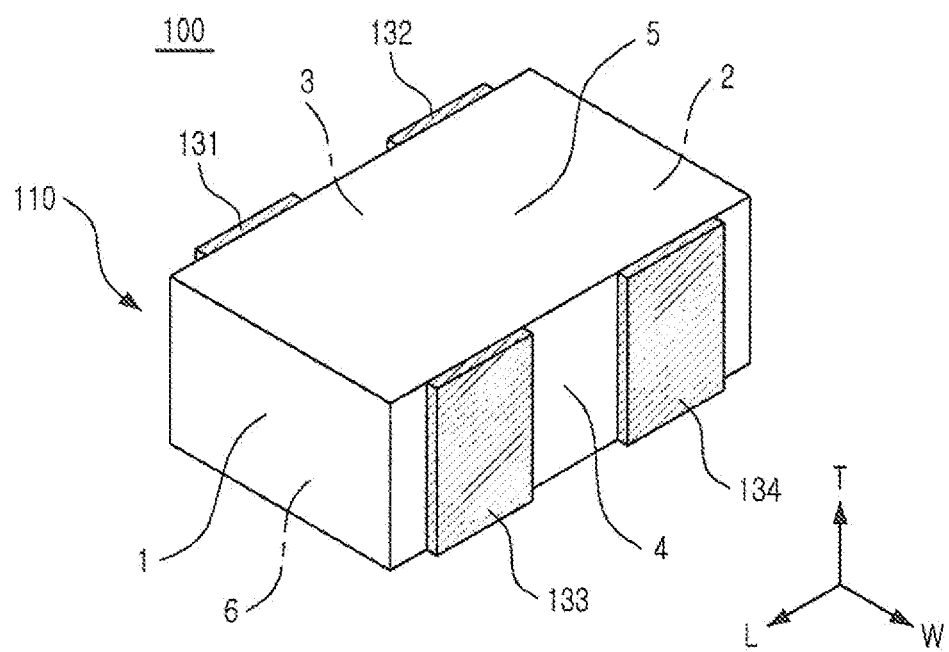
FIG. 1 is a perspective diagram of a multilayer ceramic capacitor according to a first embodiment of the present invention.

Hereinafter, embodiments of the present invention will be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art.

In the drawings, the shapes and dimensions of elements may be exaggerated for clarity, and the same or like reference numerals will be used throughout to designate the same or like elements.

Directions of a hexahedron will be defined in order to clearly describe the embodiments of the present invention. L, W and T shown in the accompanying drawings refer to a length direction, a width direction, and a thickness direction, respectively. Here, the thickness direction may be the same as a direction in which dielectric layers are stacked.

Multilayer Ceramic Capacitor

Hereinafter, embodiments of the present invention will be described in detail with reference to the accompanying drawings.

FIG. 1 is a perspective diagram of a multilayer ceramic capacitor according to a first embodiment of the present invention.

Figure 2:
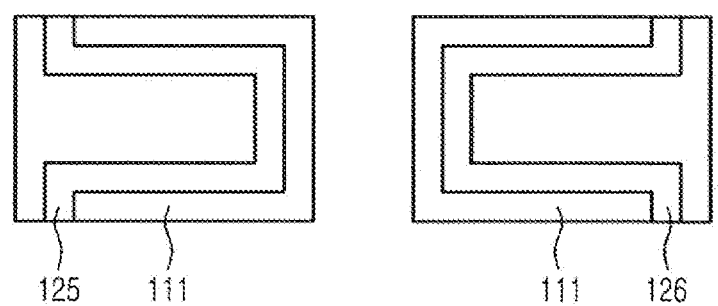
FIG. 2 is a plan diagram showing first and second internal connection conductors applicable to the multilayer ceramic capacitor shown in FIG. 1.

FIG. 2 is a plan diagram showing first and second internal connection conductors applicable to the multilayer ceramic capacitor shown in FIG. 1.

Figure 3:
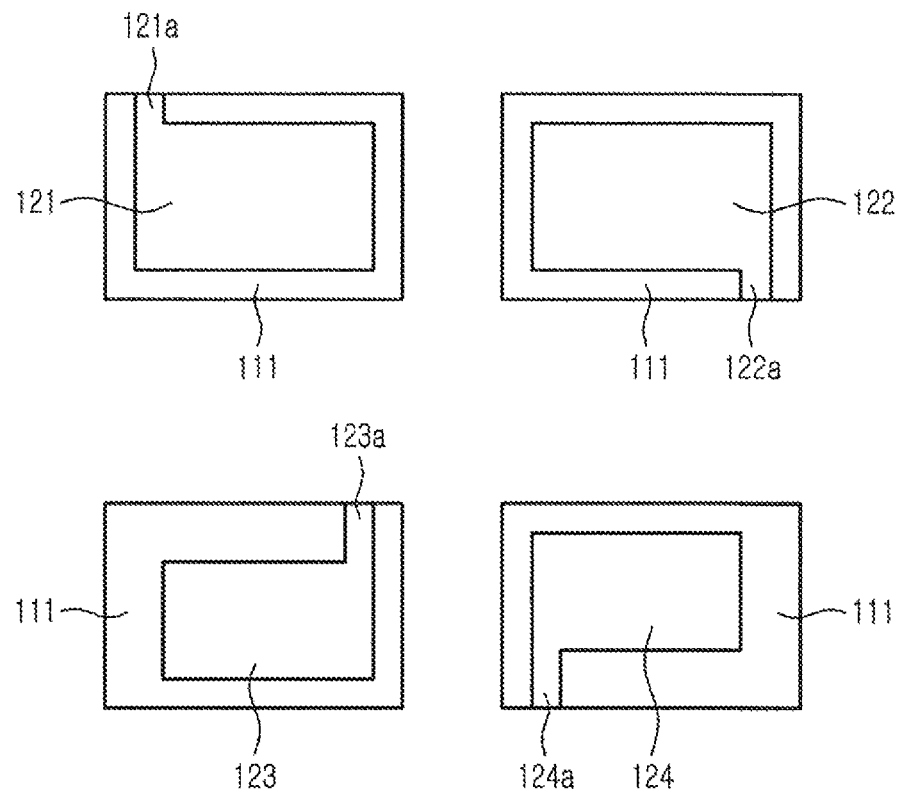
FIG. 3 is a plan diagram showing first to fourth internal electrodes usable together with the first and second internal connection conductors shown in FIG. 2.

FIG. 3 is a plan diagram showing first to fourth internal electrodes usable together with the first and second internal connection conductors shown in FIG. 2.

Referring to FIGS. 1 through 3, a multilayer ceramic capacitor 100 according to the embodiment of the invention may include a ceramic body 110 including a plurality of dielectric layers 111 and having first and second main surfaces opposing each other, first and second side surfaces opposing each other, and first and second end surfaces opposing each other.

In the present embodiment, the ceramic body 110 may have first and second main surfaces 5 and 6 opposing each other, and first and second side surfaces 3 and 4 and first and second end surfaces 1 and 2 that connect the first and second main surfaces to each other.

A shape of the ceramic body 110 is not particularly limited, but may be hexahedral as shown.

The ceramic body 110 may be formed by stacking the plurality of dielectric layers, and a plurality of internal electrodes 121 to 124 (sequentially first to fourth internal electrodes) may be disposed to be separated from each other, having the dielectric layer therebetween.

The plurality of dielectric layers 111 configuring the ceramic body 110 may be in a sintered state and be integrated with each other so as not to confirm a boundary between adjacent dielectric layers.

The dielectric layer 111 may be formed by sintering a ceramic green sheet including ceramic powder, an organic solvent, and an organic binder. As the ceramic powder, which is a high k material, a barium titanate ($BaTiO_3$) based material, a strontium titanate ($SrTiO_3$) based material, or the like, may be used. However, the ceramic powder is not limited thereto.

The multilayer ceramic capacitor 100 may include a first capacitor part formed in the ceramic body 110 and including a first internal electrode 121 having a lead 121a exposed to the first side surface 3 and a second internal electrode 122 having a lead 122a exposed to the second side surface 4 and a second capacitor part including a third internal electrode 123 having a lead 123a exposed to the first side surface 3 and spaced apart from the lead 121a of the first internal electrode and a fourth internal electrode 124 having a lead 124a exposed to the second side surface 4 and spaced apart from the lead 122a of the second internal electrode.

According to the embodiment of the invention, the first to fourth internal electrodes 121 to 124 may be formed of a conductive paste including a conductive metal.

The conductive metal is not limited thereto, but may be nickel (Ni), copper (Cu), palladium (Pd), or an alloy thereof.

An internal electrode layer may be printed on a ceramic green sheet configuring the dielectric layer using the conductive paste by a printing method such as a screen printing method or a gravure printing method.

The ceramic green sheets having the internal electrode layers printed thereon may be alternately stacked and sintered to form the ceramic body.

In addition, the multilayer ceramic capacitor 100 may include first and second internal connection conductors 125 and 126 formed in the ceramic body 110 and exposed to the first and second side surfaces 3 and 4.

The first and second internal connection conductors 125 and 126 are not particularly limited but may be formed of, for example, a conductive paste including a conductive metal, similarly to the first to fourth internal electrodes 121 to 124.

The conductive metal is not limited thereto, but may be nickel (Ni), copper (Cu), palladium (Pd), or an alloy thereof.

In addition, the multilayer ceramic capacitor 100 may include first to fourth external electrodes 131 to 134 formed on the first and second side surfaces 3 and 4 of the ceramic body 110 and electrically connected to the first to fourth internal electrodes 121 to 124 and the first and second internal connection conductors 125 and 126.

The first and second external electrodes 131 and 132 may be disposed to be spaced apart from each other on the first side surface 3 of the ceramic body 110, and the third and fourth external electrodes 133 and 134 may be disposed to be spaced apart from each other on the second side surface 4 of the ceramic body.

According to the embodiment of the invention, a mounting surface of the multilayer ceramic capacitor 100 may be the first or second side surface 3 or 4 of the ceramic body 110.

That is, the multilayer ceramic capacitor according to the embodiment of the invention may be vertically mounted but is not limited thereto. The multilayer ceramic capacitor may be mounted in various forms.

Therefore, the external electrodes contacting first and second electrode pads on a board for mounting a multilayer ceramic capacitor to be described below may be the third and fourth external electrodes 133 and 134.

According to the embodiment of the invention, it may be understood that two external electrodes 131 and 132 except for the third and fourth external electrodes 133 and 134 used as external terminals for connection with a power line are used as external electrodes for controlling ESR.

However, since the third and fourth external electrodes used as the external terminals may be optionally selected so as to be appropriate for desired ESR characteristics, the third and fourth external electrodes are not particularly limited.

The first and second external electrodes 131 and 132 capable of being used as the external electrodes for controlling ESR may be contactless terminals which are not connected to the power line as described above, and they are positioned on an upper surface of the multilayer ceramic capacitor, based on a mounting direction.

That is, according to the embodiment of the invention, since the first and second external electrodes 131 and 132, the contactless terminals, are disposed on the upper surface of the multilayer ceramic capacitor rather than a side surface, when mounted on the board, downsizing may not be hindered by the contactless terminals, which may be advantageous for miniaturization of a product.

The first to fourth external electrodes 131 to 134 may be formed of a conductive paste including a conductive metal.

The conductive metal may be nickel (Ni), copper (Cu), tin (Sn), or an alloy thereof, but is not limited thereto.

The conductive paste may further include an insulating material. The insulating material may be, for example, glass, but is not limited thereto.

A method of forming the first to fourth external electrodes 131 to 134 is not particularly limited. That is, the first to fourth external electrodes 131 to 134 may be formed on the ceramic body by a printing method, a dipping method, a plating method, or the like.

The multilayer ceramic capacitor 100 is a four-terminal capacitor having a total of four external electrodes, but the invention is not limited thereto.

Hereinafter, with regard to the configurations of the multilayer ceramic capacitor 100 according to the embodiment of the invention, the internal electrodes 121 to 124, the internal connection conductors 125 and 126, and the external electrodes 131 to 134 will be described in detail with reference to FIGS. 2 and 3.

The first capacitor part may be formed in the ceramic body 110, include the first internal electrode 121 having the lead 121a exposed to the first side surface 3 and the second internal electrode 122 having the lead 122a exposed to the second side surface 4, and form capacitance.

In addition, the second capacitor part may include the third internal electrode 123 having the lead 123a exposed to the first side surface 3 and spaced apart from the lead 121a of the first internal electrode and the fourth internal electrode 124 having the lead 124a exposed to the second side surface 4 and spaced apart from the lead 122a of the second internal electrode, and form the capacitance.

The lead 121a of the first internal electrode may be connected to the first external electrode 131, the lead 122a of the second internal electrode may be connected to the fourth external electrode 134, the lead 123a of the third internal electrode may be connected to the second external electrode 132, and the lead 124a of the fourth internal electrode may be connected to the third external electrode 133, but the invention is not limited thereto.

The first and second capacitor parts may be disposed in the ceramic body 110 without particular limitations, and in order to implement a target capacitance value, a plurality of first and second capacitor parts may be stacked.

According to the embodiment of the invention, the first and second capacitor parts may be connected in parallel with each other in the multilayer ceramic capacitor 100.

The first to fourth internal electrodes 121 to 124 may be alternately disposed together with the first and second internal connection conductors 125 and 126, having the dielectric layer 111 interposed therebetween.

The first and second internal connection conductors 125 and 126 are illustrated in FIG. 2 in an amount of one thereof, but may be provided in plural.

Similarly, the first to fourth internal electrodes 121 to 124 are illustrated in FIG. 3 in an amount of one thereof, but may be provided in plural.

Meanwhile, the internal electrodes and the internal connection conductors may be stacked in the sequence illustrated in FIGS. 2 and 3, or may be stacked in various other sequences, as necessary.

For example, the first and second internal connection conductors 125 and 126 may be disposed between the first and second capacitor parts or may be spaced apart from each other.

Particularly, the desired ESR characteristics may be more precisely controlled by changing a width, a length, and the number of layers of the first and second internal connection conductors 125 and 126.

According to the embodiment of the invention, the first internal connection conductor 125 may be connected to the first internal electrode 121 via the first external electrode 131 and connected to the fourth internal electrode 124 via the third external electrode 133.

In addition, the second internal connection conductor 126 may be connected to the second internal electrode 122 via the fourth external electrode 134 and connected to the third internal electrode 123 via the second external electrode 132.

Pattern shapes of the first and second internal connection conductors 125 and 126 shown in FIG. 2 are merely exemplary according to the embodiment of the invention, and the first and second internal connection conductors 125 and 126 may have various pattern shapes in order to control the ESR.

For example, the first and second internal connection conductors 125 and 126 may have the same pattern shapes as those of the first to fourth internal electrodes 121 to 124 as shown in FIG. 3.

According to the embodiment of the invention, the ESR of the multilayer ceramic capacitor may be controlled by the first and second internal connection conductors 125 and 126.

That is, the first capacitor part including the first and second internal electrodes 121 and 122 and the second capacitor part including the third and fourth internal electrodes 123 and 124 may be connected in parallel with each other as described below.

In addition, the first and second capacitor parts may be connected in series with the first and second internal connection conductors 125 and 126.

Due to the above-described connections, the ESR of the multilayer ceramic capacitor may be controlled by the first and second internal connection conductors 125 and 126.

In addition, in the present embodiment, the third and fourth external electrodes 133 and 134 may be used as the external terminals for connection with the power line. For example, the third external electrode 133 may be connected to a power terminal, and the fourth external electrode 134 may be connected to a ground.

Meanwhile, the first and second external electrodes 131 and 132, except for the third and fourth external electrodes 133 and 134, may be used as the external electrodes for controlling the ESR and understood as the contactless terminals.

Figure 4:
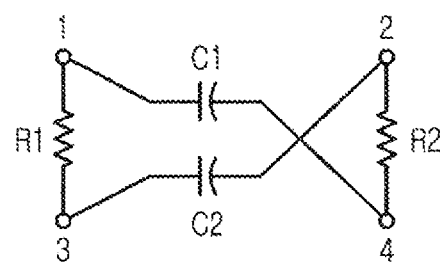
FIG. 4 is an equivalent circuit diagram of the multilayer ceramic capacitor shown in FIG. 1.

FIG. 4 is an equivalent circuit diagram of the multilayer ceramic capacitor shown in FIG. 1.

Referring to FIG. 4, the first capacitor part including the first and second internal electrodes 121 and 122 and the second capacitor part including the third and fourth internal electrodes 123 and 124 may be connected in parallel with each other.

In addition, the first and second capacitor parts may be connected in series with the first and second internal connection conductors 125 and 126.

As described above, the multilayer ceramic capacitor according to the embodiment of the invention may have two kinds of resistors and two kinds of capacitors of which respective values may be controlled.

The multilayer ceramic capacitor according to the embodiment of the invention has the above-described structure including the internal electrodes 121 to 124, the internal connection conductors 125 and 126, and the external electrodes 131 to 134, such that it may be easy to decrease and control impedance in a wider frequency range, and a mounting space and manufacturing costs may be decreased due to a decrease in the number of components, as compared to the existing structure.

In addition, as the capacitor is vertically mounted, downsizing may not be hindered by the contactless terminals, which may be advantageous in terms of miniaturization of the product.

Figure 5:
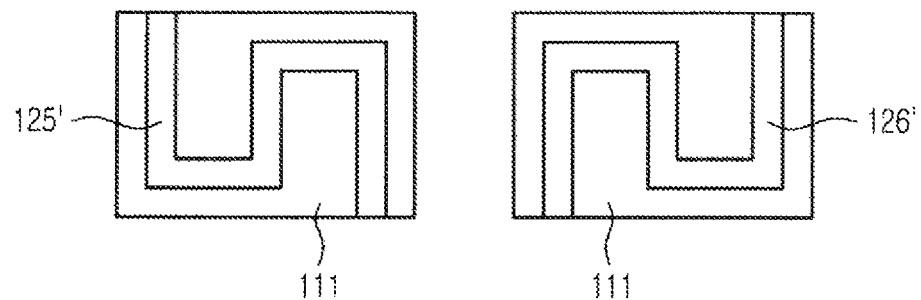
FIG. 5 is a plan diagram showing first and second internal connection conductors applicable to a multilayer ceramic capacitor according to a second embodiment of the present invention.

FIG. 5 is a plan diagram showing first and second internal connection conductors applicable to a multilayer ceramic capacitor according to a second embodiment of the invention.

Figure 6:
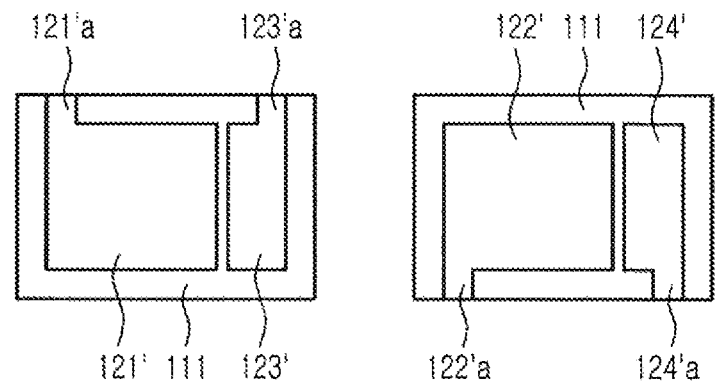
FIG. 6 is a plan diagram showing first to fourth internal electrodes usable together with the first and second internal connection conductors shown in FIG. 5.

FIG. 6 is a plan diagram showing first to fourth internal electrodes usable together with the first and second internal connection conductors shown in FIG. 5.

Figure 7:
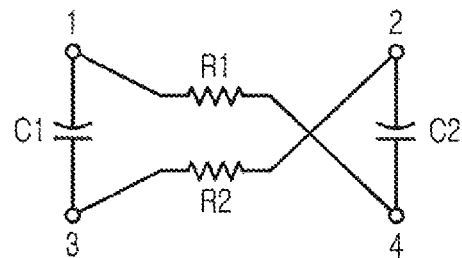
FIG. 7 is an equivalent circuit diagram of the multilayer ceramic capacitor according to the second embodiment of the present invention.

FIG. 7 is an equivalent circuit diagram of the multilayer ceramic capacitor according to the second embodiment of the invention.

Referring to FIGS. 5 through 7, the multilayer ceramic capacitor according to the embodiment of the invention may be characterized in that in the above-described multilayer ceramic capacitor according to the first embodiment of the invention, first and third internal electrodes 121' and 123' are formed to be spaced apart from each other on a single layer, and second and fourth internal electrodes 122' and 124' are formed to be spaced apart from each other on another single layer, in a cross section of the ceramic body 110 in a length-width direction.

According to the second embodiment of the invention, a lead 121'a of the first internal electrode may be connected to the first external electrode 131, a lead 122'a of the second internal electrode may be connected to the third external electrode 133, a lead 123'a of the third internal electrode may be connected to the second external electrode 132, and a lead 124'a of the fourth internal electrode may be connected to the fourth external electrode 134.

According to this embodiment of the invention, a first internal connection conductor 125' may be connected to the first internal electrode 121' via the first external electrode 131 and connected to the fourth internal electrode 124' via the fourth external electrode 134.

According to this embodiment of the invention, a second internal connection conductor 126' may be connected to the second internal electrode 122' via the third external electrode 133 and connected to the third internal electrode 123' via the second external electrode 132.

Referring to FIG. 7, the first and second internal connection conductors 125' and 126' may be connected in parallel with each other.

Further, a first capacitor part including the first and second internal electrodes 121' and 122' and a second capacitor part including the third and fourth internal electrodes 123' and 124' may be connected in series with the first and second internal connection conductors 125' and 126'.

Since other features of the multilayer ceramic capacitor according to the second embodiment of the invention are the same as those of the multilayer ceramic capacitor according to the first embodiment of the invention, a detailed description thereof will be omitted.

Figure 8:
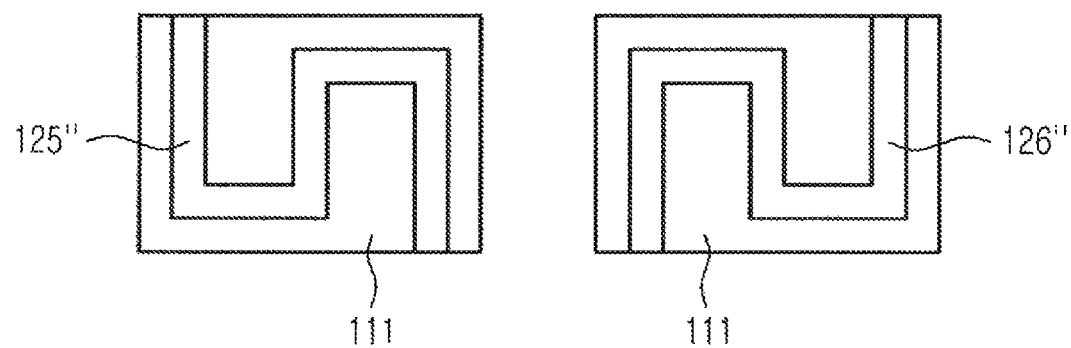
FIG. 8 is a plan diagram showing first and second internal connection conductors applicable to a multilayer ceramic capacitor according to a third embodiment of the present invention.

FIG. 8 is a plan diagram showing first and second internal connection conductors applicable to a multilayer ceramic capacitor according to a third embodiment of the invention.

Figure 9:
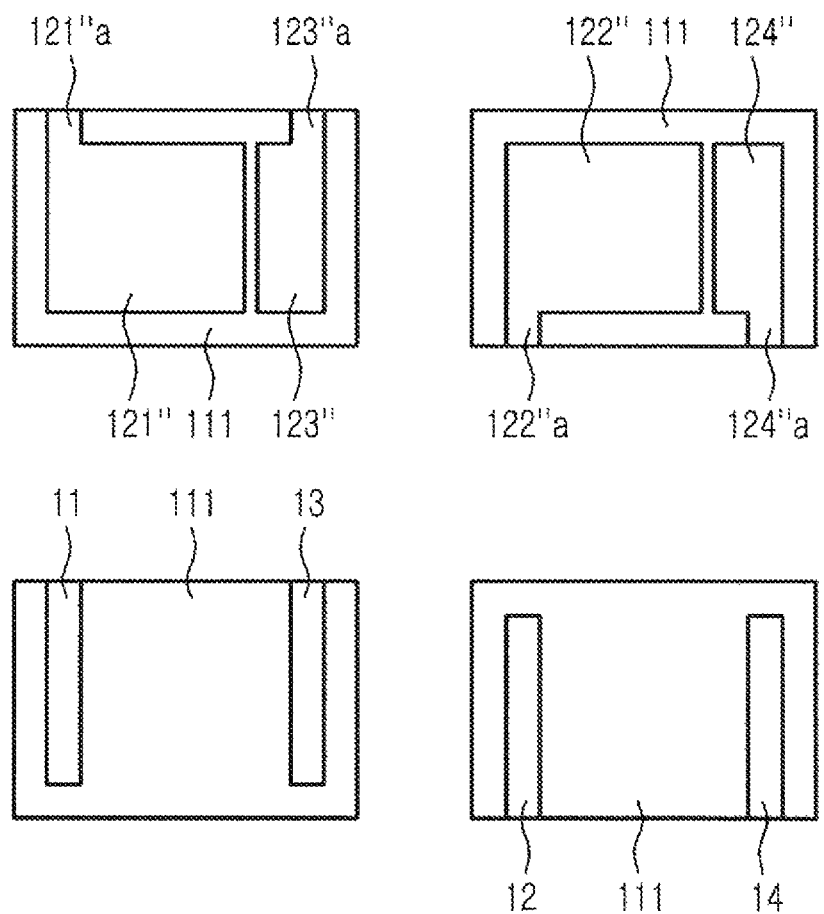
FIG. 9 is a plan diagram showing first to eighth internal electrodes usable together with the first and second internal connection conductors shown in FIG. 8.

FIG. 9 is a plan diagram showing first to eighth internal electrodes usable together with the first and second internal connection conductors shown in FIG. 8.

Figure 10:
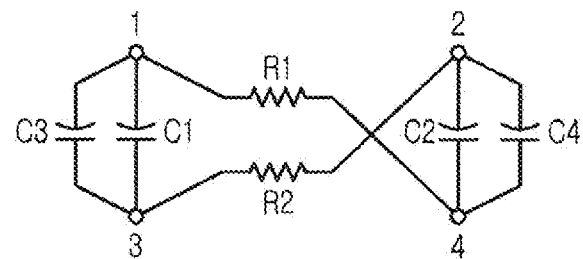
FIG. 10 is an equivalent circuit diagram of the multilayer ceramic capacitor according to the third embodiment of the present invention.

FIG. 10 is an equivalent circuit diagram of the multilayer ceramic capacitor according to the third embodiment of the invention.

Referring to FIGS. 8 through 10, the multilayer ceramic capacitor according to the third embodiment of the invention may be characterized in that in the above-described multilayer ceramic capacitor according to the first embodiment of the invention, a third capacitor part formed in the ceramic body 110 and including a fifth internal electrode 11 exposed to the first side surface 3 and a sixth internal electrode 12 exposed to the second side surface 4 and a fourth capacitor part including seventh and eighth internal electrodes 13 and 14 are further included, wherein the fifth and seventh internal electrodes 11 and 13 are formed to be spaced apart from each other on a single layer, and the sixth and eighth internal electrodes 12 and 14 are formed to be spaced apart from each other on another single layer, in the cross section of the ceramic body 110 in the length-width direction.

According to this embodiment of the invention, the fifth internal electrode 11 may be connected to the first external electrode 131, the sixth internal electrode 12 may be connected to the third external electrode 133, the seventh internal electrode 13 may be connected to the second external electrode 132, and the eighth internal electrodes 14 may be connected to the fourth external electrode 134.

According to this embodiment of the invention, a lead 121"a of a first internal electrode 121" may be connected to the first external electrode 131, a lead 122"a of a second internal electrode 122" may be connected to the third external electrode 133, a lead 123"a of a third internal electrode 123" may be connected to the second external electrode 132, and a lead 124"a of a fourth internal electrode 124" may be connected to the fourth external electrode 134.

According to this embodiment of the invention, a first internal connection conductor 125" may be connected to the first internal electrode 121" via the first external electrode 131 and connected to the fourth internal electrode 124" via the fourth external electrode 134.

According to this embodiment of the invention, a second internal connection conductor 126" may be connected to the second internal electrode 122" via the third external electrode 133 and connected to the third internal electrode 123" via the second external electrode 132.

Referring to FIG. 10, the first and second internal connection conductors 125" and 126" may be connected in parallel with each other.

In addition, the first to fourth capacitor parts may be connected in parallel with each other.

In addition, a first capacitor part including the first and second internal electrodes 121" and 122", a second capacitor part including the third and fourth internal electrodes 123" and 124", the third capacitor part including the fifth and sixth internal electrodes 11 and 12, and the fourth capacitor part including the seventh and eighth internal electrodes 13 and 14 may be connected in series with the first and second internal connection conductors 125" and 126".

Since other features of the multilayer ceramic capacitor according to the third embodiment of the invention are the same as those of the multilayer ceramic capacitor according to the first embodiment of the invention, a detailed description thereof will be omitted.

Figure 11:
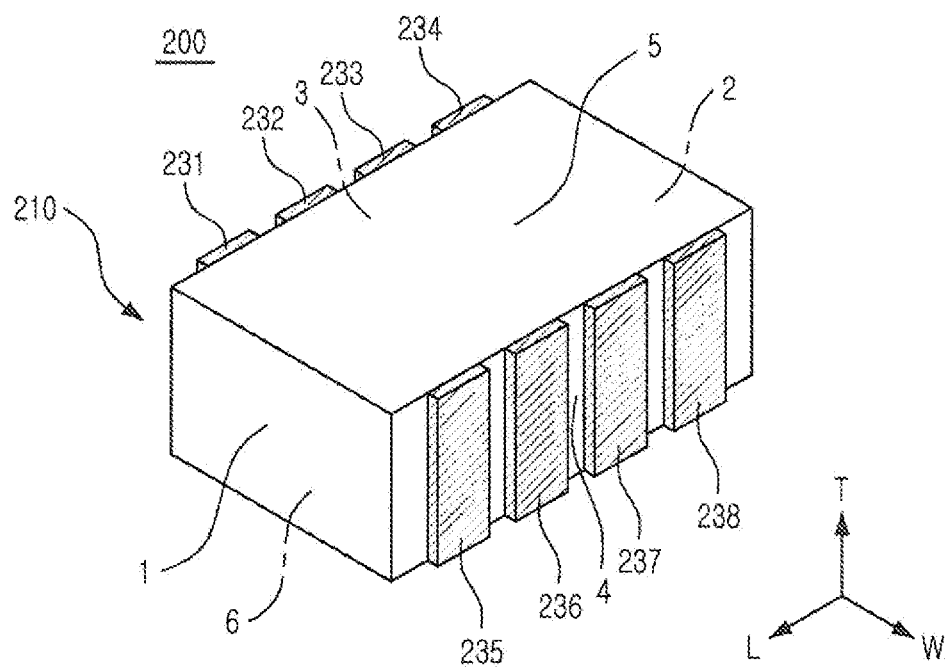
FIG. 11 is a perspective diagram of a multilayer ceramic capacitor according to a fourth embodiment of the present invention.

FIG. 11 is a perspective diagram of a multilayer ceramic capacitor according to a fourth embodiment of the invention.

Figure 12:
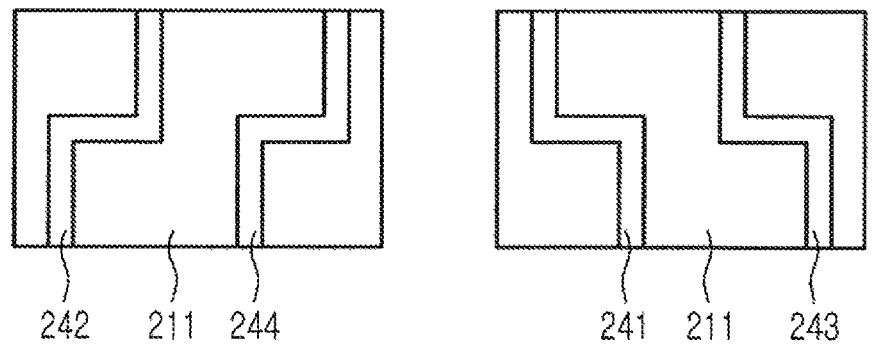
FIG. 12 is a plan diagram showing first to fourth internal connection conductors applicable to the multilayer ceramic capacitor shown in FIG. 11.

FIG. 12 is a plan diagram showing first to fourth internal connection conductors applicable to the multilayer ceramic capacitor shown in FIG. 11.

Figure 13:
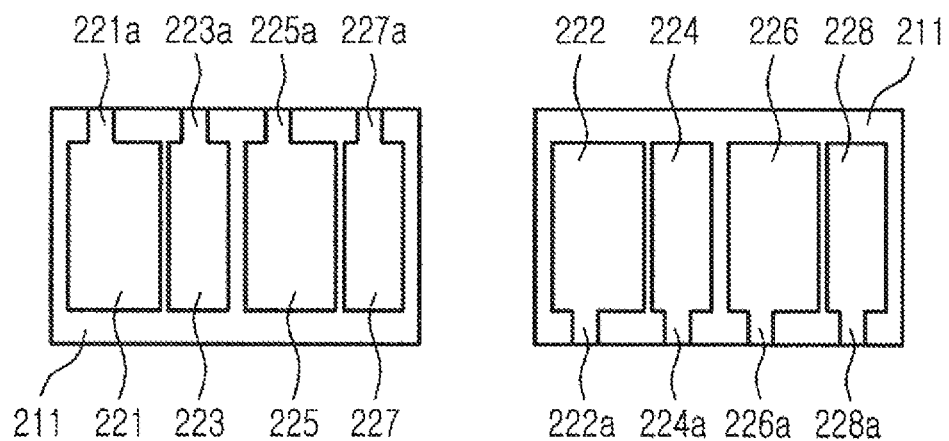
FIG. 13 is a plan diagram showing first to eighth internal electrodes usable together with the first to fourth internal connection conductors shown in FIG. 12.

FIG. 13 is a plan diagram showing first to eighth internal electrodes usable together with the first to fourth internal connection conductors shown in FIG. 12.

Figure 14:
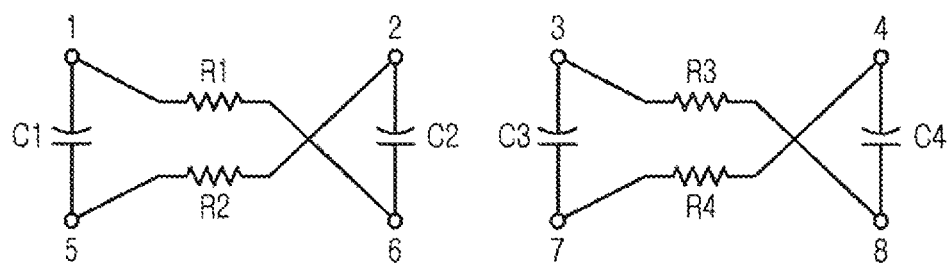
FIG. 14 is an equivalent circuit diagram of the multilayer ceramic capacitor shown in FIG. 11.

FIG. 14 is an equivalent circuit diagram of the multilayer ceramic capacitor shown in FIG. 11.

Referring to FIGS. 11 through 14, a multilayer ceramic capacitor 200 according to the fourth embodiment of the invention may include: a ceramic body 210 including a plurality of dielectric layers 211 and having first and second main surfaces 5 and 6 opposing each other, first and second side surfaces 3 and 4 opposing each other, and first and second end surfaces 1 and 2 opposing each other; first, third, fifth, and seventh internal electrodes 221, 223, 225, and 227 exposed to the first side surface 3 and formed to be spaced apart from each other on a single layer in a cross section of the ceramic body 210 in a length-width direction and second, fourth, sixth, and eighth internal electrodes 222, 224, 226, and 228 exposed to the second side surface 4 and formed to be spaced apart from each other on another single layer in the cross section of the ceramic body 210 in the length-width direction; first to fourth internal connection conductors 241 to 244 formed in the ceramic body 210 and exposed to the first and second side surfaces 3 and 4; and first to eighth external electrodes 231 to 238 formed on the first and second side surfaces 3 and 4 of the ceramic body 210 and electrically connected to the first to eighth internal electrodes 221 to 228 and the first to fourth internal connection conductors 241 to 244. The first and second internal electrodes 221 and 222, the third and fourth internal electrodes 223 and 224, the fifth and sixth internal electrodes 225 and 226, and the seventh and eighth internal electrodes 227 and 228 form first, second, third, and fourth capacitor parts, respectively. The first and second capacitor parts are connected in series with the first and second internal connection conductors 241 and 242, respectively, and the third and fourth capacitor parts are connected in series with the third and fourth internal connection conductors 243 and 244, respectively.

According to this embodiment of the invention, the first to fourth external electrodes 231 to 234 may be disposed to be spaced apart from each other on the first side surface 3 of the ceramic body, and the fifth to eighth external electrodes 235 to 238 may be disposed to be spaced apart from each other on the second side surface 4 of the ceramic body.

According to this embodiment of the invention, a mounting surface of the multilayer ceramic capacitor 200 may be the first or second side surface 3 or 4 of the ceramic body 210.

According to the embodiment of the invention, the first, third, fifth, seventh, second, fourth, sixth, and eighth internal electrodes 221, 223, 225, 227, 222, 224, 226, and 228 may be sequentially connected to the first to eighth external electrodes 231, 232, 233, 234, 235, 236, 237, and 238, respectively.

According to this embodiment of the invention, the first internal connection conductor 241 may be connected to the first internal electrode 221 via the first external electrode 231 and connected to the fourth internal electrode 224 via the sixth external electrode 236.

According to this embodiment of the invention, the second internal connection conductor 242 may be connected to the second internal electrode 222 via the fifth external electrode 235 and connected to the third internal electrode 223 via the second external electrode 232.

According to this embodiment of the invention, the third internal connection conductor 243 may be connected to the fifth internal electrode 225 via the third external electrode 233 and connected to the eighth internal electrode 228 via the eighth external electrode 238.

According to this embodiment of the invention, the fourth internal connection conductor 244 may be connected to the sixth internal electrode 226 via the seventh external electrode 237 and connected to the seventh internal electrode 227 via the fourth external electrode 234.

Referring to FIG. 14, the first and second internal connection conductors 241 and 242 and the third and fourth internal connection conductors 243 and 244 may be connected in parallel with each other, respectively.

In addition, the first to fourth capacitor parts may be connected in parallel with each other.

Further, the first capacitor part including the first and second internal electrodes 221 and 222 and the second capacitor part including the third and fourth internal electrodes 223 and 224 may be connected in series with the first and second internal connection conductors 241 and 242.

In addition, the third capacitor part including the fifth and sixth internal electrodes 225 and 226 and the fourth capacitor part including the seventh and eighth internal electrodes 227 and 228 may be connected in series with the third and fourth internal connection conductors 243 and 244.

Since other features of the multilayer ceramic capacitor according to the fourth embodiment of the invention are the same as those of the above-described multilayer ceramic capacitor according to the first embodiment of the invention, a detailed description thereof will be omitted.

Figure 15:
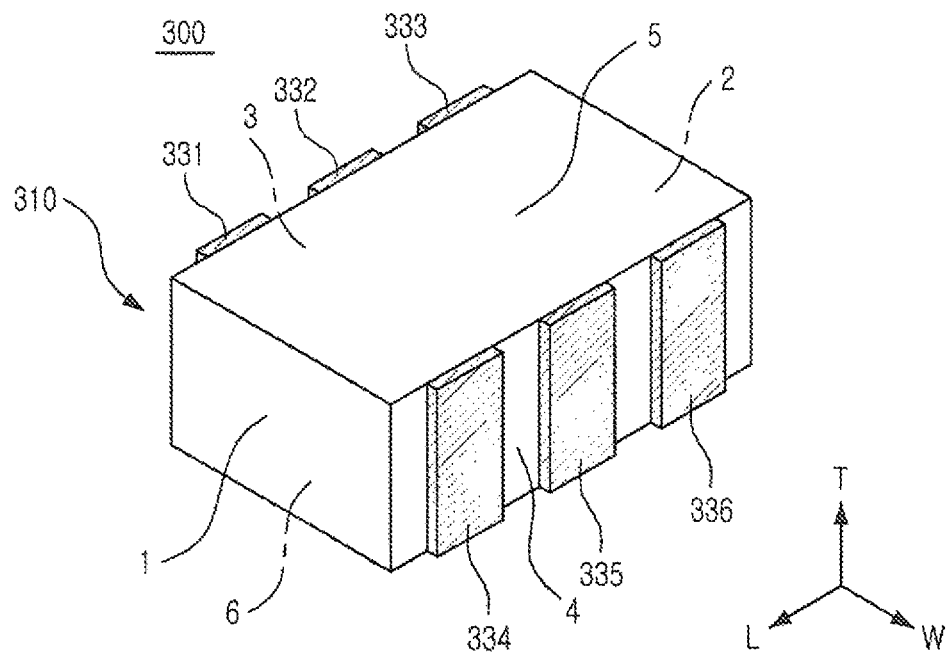
FIG. 15 is a perspective diagram of a multilayer ceramic capacitor according to a fifth embodiment of the present invention.

FIG. 15 is a perspective diagram of a multilayer ceramic capacitor according to a fifth embodiment of the present invention.

Figure 16:
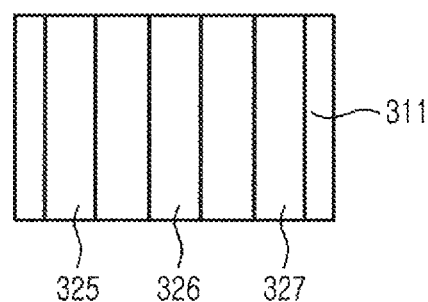
FIG. 16 is a plan diagram showing first to third internal connection conductors applicable to the multilayer ceramic capacitor shown in FIG. 15.

FIG. 16 is a plan diagram showing first to third internal connection conductors applicable to the multilayer ceramic capacitor shown in FIG. 15.

Figure 17:
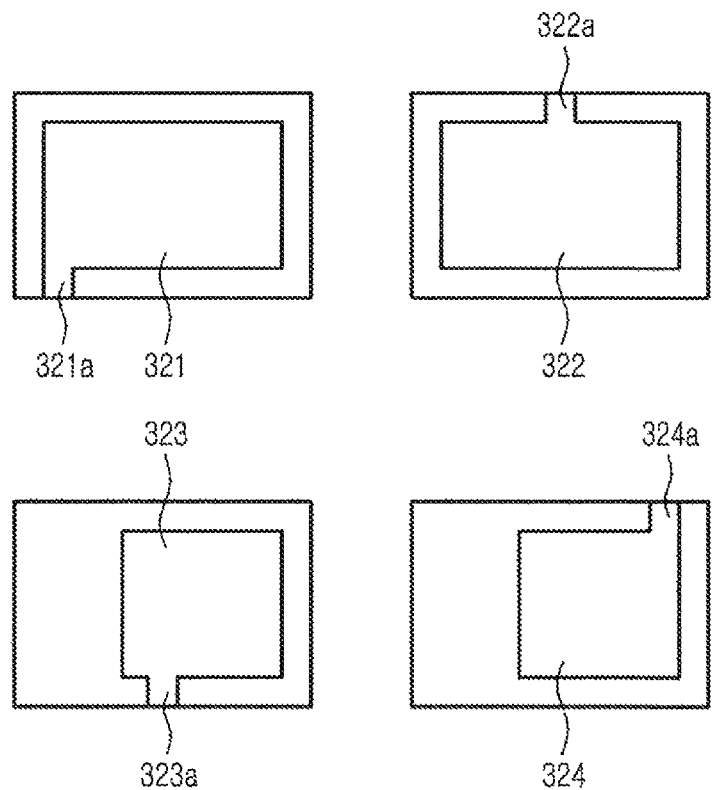
FIG. 17 is a plan diagram showing first to fourth internal electrodes usable together with the first to third internal connection conductors shown in FIG. 16.

FIG. 17 is a plan diagram showing first to fourth internal electrodes usable together with the first to third internal connection conductors shown in FIG. 16.

Figure 18:
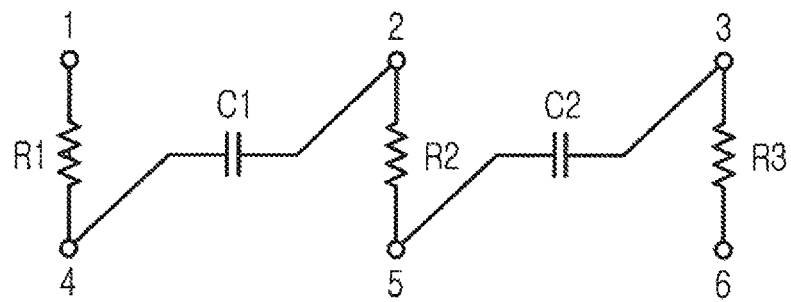
FIG. 18 is an equivalent circuit diagram of the multilayer ceramic capacitor shown in FIG. 15.

FIG. 18 is an equivalent circuit diagram of the multilayer ceramic capacitor shown in FIG. 15.

Referring to FIGS. 15 through 18, a multilayer ceramic capacitor 300 according to the fifth embodiment of the invention may include a ceramic body 310 including a plurality of dielectric layers 311 and having first and second main surfaces 5 and 6 opposing each other, first and second side surfaces 3 and 4 opposing each other, and first and second end surfaces 1 and 2 opposing each other; a first capacitor part formed in the ceramic body 310 and including a first internal electrode 321 having a lead 321a exposed to the second side surface 4 and a second internal electrode 322 having a lead 322a exposed to the first side surface 3 and a second capacitor part including a third internal electrode 323 having a lead 323a exposed to the second side surface 4 and spaced apart from the lead 321a of the first internal electrode and a fourth internal electrode 324 having a lead 324a exposed to the first side surface 3 and spaced apart from the lead 322a of the second internal electrode; first to third internal connection conductors 325 to 327 formed in the ceramic body 310 and exposed to the first and second side surfaces 3 and 4; and first to sixth external electrodes 331 to 336 formed on the first and second side surfaces 3 and 4 of the ceramic body 310 and electrically connected to the first to fourth internal electrodes 321 to 324 and the first to third internal connection conductors 325 to 327, wherein the first capacitor part is connected in series with the first and second internal connection conductors 325 and 326, and the second capacitor part is connected in series with the second and third internal connection conductors 326 and 327.

According to this embodiment of the invention, the first to third external electrodes 331 to 333 may be disposed to be spaced apart from each other on the first side surface 3 of the ceramic body, and the fourth to sixth external electrodes 334 to 336 may be disposed to be spaced apart from each other on the second side surface 4 of the ceramic body.

According to this embodiment of the invention, a mounting surface of the multilayer ceramic capacitor 300 may be the first or second side surface 3 or 4 of the ceramic body.

According to this embodiment of the invention, the lead 321a of the first internal electrode 321 may be connected to the fourth external electrode 334, the lead 322a of the second internal electrode 322 may be connected to the second external electrode 332, the lead 323a of the third internal electrode 323 may be connected to the fifth external electrode 335, and the lead 324a of the fourth internal electrode 324 may be connected to the third external electrode 333.

According to this embodiment of the invention, the first internal connection conductor 325 may be connected to the first external electrode 331 and may be connected to the first internal electrode 321 via the fourth external electrode 334.

According to this embodiment of the invention, the second internal connection conductor 326 may be connected to the second internal electrode 322 via the second external electrode 332 and connected to the third internal electrode 323 via the fifth external electrode 335.

According to this embodiment of the invention, the first internal connection conductor 327 may be connected to the sixth external electrode 336 and may be connected to the fourth internal electrode 324 via the third external electrode 333.

Referring to FIG. 18, the first to third internal connection conductors 325 to 327 may be connected in parallel with each other.

In addition, the first capacitor part including the first and second internal electrodes 321 and 322 may be connected in series with the first and second internal connection conductors 325 and 326.

In addition, the second capacitor part including the third and fourth internal electrodes 323 and 324 may be connected in series with the second and third internal connection conductors 326 and 327.

Since other features of the multilayer ceramic capacitor according to the fifth embodiment of the invention are the same as those of the multilayer ceramic capacitor according to the first embodiment of the invention, a detailed description thereof will be omitted.

Board for Mounting Multilayer Ceramic Capacitor

Figure 19:
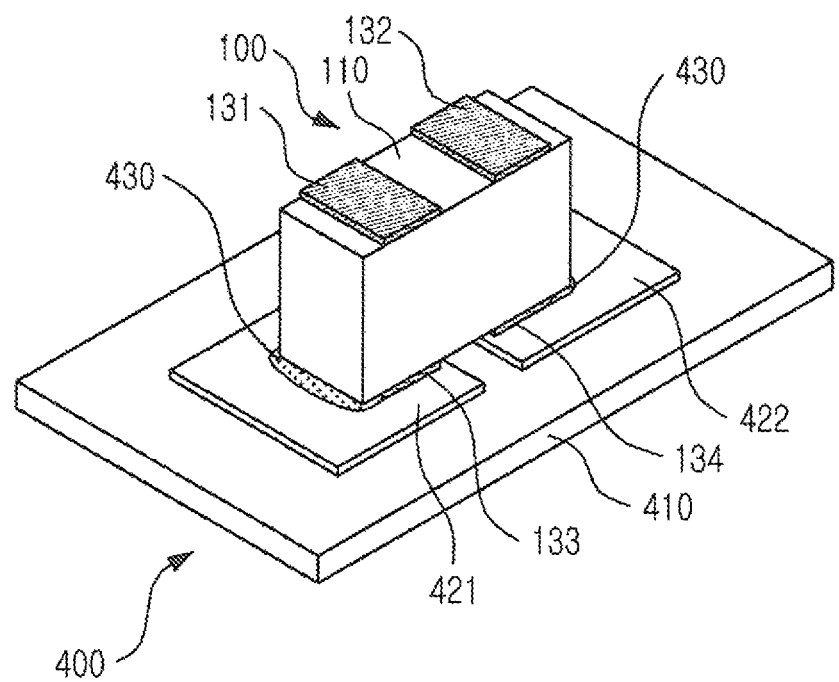
FIG. 19 is a perspective diagram showing the multilayer ceramic capacitor of FIG. 1 mounted on a printed circuit board.

FIG. 19 is a perspective diagram showing the multilayer ceramic capacitor of FIG. 1 mounted on a printed circuit board.

Referring to FIG. 19, a board 400 for mounting a multilayer ceramic capacitor 100 according to the embodiment of the invention may include a printed circuit board 410 on which the multilayer ceramic capacitor 100 is vertically mounted and first and second electrode pads 421 and 422 formed on the printed circuit board 410 to be spaced apart from each other.

In this case, the multilayer ceramic capacitor 100 may be electrically connected to the printed circuit board 410 by solder 430 in a state in which the third and fourth external electrodes 133 and 134 contact the first and second electrode pads 421 and 422, respectively.

Except for the above-mentioned description, a description of features overlapped with those of the above-described multilayer ceramic capacitor according to the first embodiment of the invention will be omitted.

Figure 20:
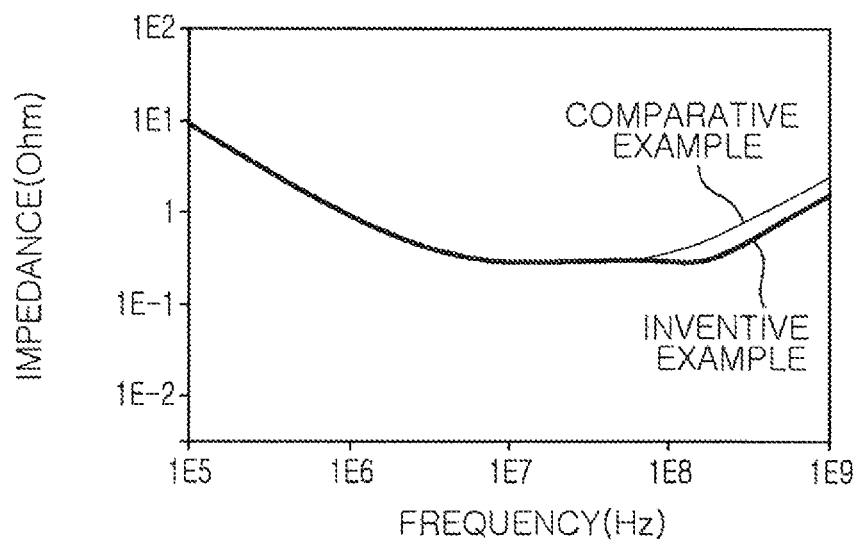
FIG. 20 is a graph for comparing impedances between Inventive Example and Comparative Example.

FIG. 20 is a graph for comparing impedances between Inventive Example and Comparative Example.

Referring to FIG. 20, it may be appreciated that in the multilayer ceramic capacitor according to the embodiment of the invention, impedance may be flat in a wider frequency region and be decreased, in comparison with Comparative Example, a multilayer ceramic capacitor according to the related art.

As set forth above, according to embodiments of the invention, the multilayer ceramic capacitor may have two kinds of resistors and capacitors of which respective values may be controlled.

Therefore, as compared with the structure according to the related art, it may be easy to decrease and control the impedance in the wider frequency region, and as the number of components is decreased, the mounting space and manufacturing costs may be decreased.

In addition, as the capacitor is vertically mounted, downsizing may not be hindered by the contactless terminals, which may be advantageous in terms of miniaturization of the product.

While the present invention has been shown and described in connection with the embodiments, it will be apparent to those skilled in the art that modifications and variations can be made without departing from the spirit and scope of the invention as defined by the appended claims.

What is claimed is:

1. A multilayer ceramic capacitor comprising:
a ceramic body including a plurality of dielectric layers and having first and second main surfaces opposing each other, first and second side surfaces opposing each other, and first and second end surfaces opposing each other;
a first capacitor part formed in the ceramic body and including a first internal electrode having a lead exposed to the first side surface and a second internal electrode having a lead exposed to the second side surface, and a second capacitor part formed in the ceramic body and including a third internal electrode having a lead exposed to the first side surface and spaced apart from the lead of the first internal electrode and a fourth internal electrode having a lead exposed to the second side surface and spaced apart from the lead of the second internal electrode;
first and second internal connection conductors formed in the ceramic body and exposed to the first and second side surfaces; and
first to fourth external electrodes formed on the first and second side surfaces of the ceramic body and electrically connected to the first to fourth internal electrodes and the first and second internal connection conductors,
wherein the first and second capacitor parts are connected in series with the first and second internal connection conductors, respectively.

2. The multilayer ceramic capacitor of claim 1, wherein the first and second external electrodes are disposed to be spaced apart from each other on the first side surface of the ceramic body, and
the third and fourth external electrodes are disposed to be spaced apart from each other on the second side surface of the ceramic body.

3. The multilayer ceramic capacitor of claim 1, wherein a mounting surface of the multilayer ceramic capacitor is the first or second side surface of the ceramic body.

4. The multilayer ceramic capacitor of claim 1, wherein the lead of the first internal electrode is connected to the first external electrode,
the lead of the second internal electrode is connected to the fourth external electrode,
the lead of the third internal electrode is connected to the second external electrode, and
the lead of the fourth internal electrode is connected to the third external electrode.

5. The multilayer ceramic capacitor of claim 4, wherein the first internal connection conductor is connected to the first internal electrode via the first external electrode and connected to the fourth internal electrode via the third external electrode.

6. The multilayer ceramic capacitor of claim 4, wherein the second internal connection conductor is connected to the second internal electrode via the fourth external electrode and connected to the third internal electrode via the second external electrode.

7. The multilayer ceramic capacitor of claim 1, wherein the first and third internal electrodes are formed to be spaced apart from each other on a single layer in a cross-section of the ceramic body in a length-width direction, and
the second and fourth internal electrodes are formed to be spaced apart from each other on another single layer in the cross-section of the ceramic body in the length-width direction.

8. The multilayer ceramic capacitor of claim 7, wherein the lead of the first internal electrode is connected to the first external electrode,
the lead of the second internal electrode is connected to the third external electrode, the lead of the third internal electrode is connected to the second external electrode, and the lead of the fourth internal electrode is connected to the fourth external electrode.

9. The multilayer ceramic capacitor of claim 7, wherein the first internal connection conductor is connected to the first internal electrode via the first external electrode and connected to the fourth internal electrode via the fourth external electrode.

10. The multilayer ceramic capacitor of claim 7, wherein the second internal connection conductor is connected to the second internal electrode via the third external electrode and connected to the third internal electrode via the second external electrode.

11. The multilayer ceramic capacitor of claim 7, further comprising:

a third capacitor part formed in the ceramic body and including a fifth internal electrode exposed to the first side surface and a sixth internal electrode exposed to the second side surface and a fourth capacitor part formed in the ceramic body and including seventh and eighth internal electrodes, wherein the fifth and seventh internal electrodes are formed to be spaced apart from each other on a single layer in the cross-section of the ceramic body in the length-width direction, and the sixth and eighth internal electrodes are formed to be spaced apart from each other on another single layer in the cross-section of the ceramic body in the length-width direction.

12. The multilayer ceramic capacitor of claim 11, wherein the fifth internal electrode is connected to the first external electrode, the sixth internal electrode is connected to the third external electrode, the seventh internal electrode is connected to the second external electrode, and the eighth internal electrode is connected to the fourth external electrode.

13. A multilayer ceramic capacitor comprising:

a ceramic body including a plurality of dielectric layers and having first and second main surfaces opposing each other, first and second side surfaces opposing each other, and first and second end surfaces opposing each other;

first, third, fifth, and seventh internal electrodes exposed to the first side surface and formed to be spaced apart from each other on a single layer in a cross section of the ceramic body in a length-width direction, and second, fourth, sixth, and eighth internal electrodes exposed to second side surface and formed to be spaced apart from each other on another single layer in the cross section of the ceramic body in the length-width direction;

first to fourth internal connection conductors formed in the ceramic body and exposed to the first and second side surfaces; and first to eighth external electrodes formed on the first and second side surfaces of the ceramic body and electrically connected to the first to eighth internal electrodes and the first to fourth internal connection conductors, wherein the first and second internal electrodes, the third and fourth internal electrodes, the fifth and sixth internal electrodes, and the seventh and eighth internal electrodes form first, second, third, and fourth capacitor parts, respectively, the first and second capacitor parts being connected in series with the first and second internal connection conductors, respectively, and the third and fourth capacitor parts being connected in series with the third and fourth internal connection conductors, respectively.

14. The multilayer ceramic capacitor of claim 13, wherein the first to fourth external electrodes are disposed to be spaced apart from each other on the first side surface of the ceramic body, and the fifth to eighth external electrodes are disposed to be spaced apart from each other on the second side surface of the ceramic body.

15. The multilayer ceramic capacitor of claim 13, wherein a mounting surface of the multilayer ceramic capacitor is the first or second side surface of the ceramic body.

16. The multilayer ceramic capacitor of claim 13, wherein the first, third, fifth, seventh, second, fourth, sixth, and eighth internal electrodes are connected to the first to eighth external electrodes, respectively.

17. The multilayer ceramic capacitor of claim 13, wherein the first internal connection conductor is connected to the first internal electrode via the first external electrode and connected to the fourth internal electrode via the sixth external electrode.

18. The multilayer ceramic capacitor of claim 13, wherein the second internal connection conductor is connected to the second internal electrode via the fifth external electrode and connected to the third internal electrode via the second external electrode.

19. The multilayer ceramic capacitor of claim 13, wherein the third internal connection conductor is connected to the fifth internal electrode via the third external electrode and connected to the eighth internal electrode via the eighth external electrode.

20. The multilayer ceramic capacitor of claim 13, wherein the fourth internal connection conductor is connected to the sixth internal electrode via the seventh external electrode and connected to the seventh internal electrode via the fourth external electrode.

21. A multilayer ceramic capacitor comprising:

a ceramic body including a plurality of dielectric layers and having first and second main surfaces opposing each other, first and second side surfaces opposing each other, and first and second end surfaces opposing each other;

a first capacitor part formed in the ceramic body and including a first internal electrode having a lead exposed to the second side surface and a second internal electrode having a lead exposed to the first side surface, and a second capacitor part formed in the ceramic body and including a third internal electrode having a lead exposed to the second side surface and spaced apart from the lead of the first internal electrode and a fourth internal electrode having a lead exposed to the first side surface and spaced apart from the lead of the second internal electrode;

first to third internal connection conductors formed in the ceramic body and exposed to the first and second side surfaces; and first to sixth external electrodes formed on the first and second side surfaces of the ceramic body and electrically connected to the first to fourth internal electrodes and the first to third internal connection conductors, wherein the first capacitor part is connected in series with the first and second internal connection conductors, and the second capacitor part is connected in series with the second and third internal connection conductors.

22. The multilayer ceramic capacitor of claim 21, wherein the first to third external electrodes are disposed to be spaced apart from each other on the first side surface of the ceramic body, and
the fourth to sixth external electrodes are disposed to be spaced apart from each other on the second side surface of the ceramic body.

23. The multilayer ceramic capacitor of claim 21, wherein a mounting surface of the multilayer ceramic capacitor is the first or second side surface of the ceramic body.

24. The multilayer ceramic capacitor of claim 21, wherein the lead of the first internal electrode is connected to the fourth external electrode,
the lead of the second internal electrode is connected to the second external electrode,
the lead of the third internal electrode is connected to the fifth external electrode, and
the lead of the fourth internal electrode is connected to the third external electrode.

25. The multilayer ceramic capacitor of claim 21, wherein the first internal connection conductor is connected to the first external electrode, and is connected to the first internal electrode via the fourth external electrode.

26. The multilayer ceramic capacitor of claim 21, wherein the second internal connection conductor is connected to the second internal electrode via the second external electrode and connected to the third internal electrode via the fifth external electrode.

27. The multilayer ceramic capacitor of claim 21, wherein the third internal connection conductor is connected to the sixth external electrode, and is connected to the fourth internal electrode via the third external electrode.

28. A board for mounting a multilayer ceramic capacitor, the board comprising:
a printed circuit board having first and second electrode pads thereon; and
the multilayer ceramic capacitor of claim 1 mounted on the printed circuit board.

* * * * *

UNITED STATES PATENT AND TRADEMARK OFFICE
CERTIFICATE OF CORRECTION

PATENT NO. : 9,524,828 B2
APPLICATION NO. : 13/949838
DATED : December 20, 2016
INVENTOR(S) : Min Cheol Park et al.

Page 1 of 1

It is certified that error appears in the above-identified patent and that said Letters Patent is hereby corrected as shown below:

On the Title Page

[30] Foreign Application Priority Data should read:
Apr. 22, 2013           (KR)    10-2013-0044156

Signed and Sealed this
Third Day of April, 2018

Andrei Iancu
*Director of the United States Patent and Trademark Office*